United States Patent [19]

Link

[11] 4,039,938
[45] Aug. 2, 1977

[54] METHOD AND APPARATUS FOR DETECTING FAULTS IN BURIED INSULATED CONDUCTORS

[75] Inventor: John Barry Link, Liberty, N.C.

[73] Assignee: Bell Telephone Laboratories, Incorporated, Murray Hill, N.J.

[21] Appl. No.: 721,455

[22] Filed: Sept. 8, 1976

[51] Int. Cl.² .............................................. G01R 31/08
[52] U.S. Cl. .......................................... 324/52; 324/54
[58] Field of Search ....................... 324/51, 52, 54, 66, 324/67; 179/175.3 F

[56] References Cited

U.S. PATENT DOCUMENTS

| 2,789,268 | 4/1957 | Bechtel et al. | 324/66 |
| 3,299,351 | 1/1967 | Williams | 324/52 |
| 3,792,350 | 2/1974 | Bossler et al. | 324/52 |
| 3,860,866 | 1/1975 | Dornberger | 324/52 |
| 3,967,190 | 6/1976 | Fonge | 324/9 X |
| 3,991,363 | 11/1976 | Lathrop | 324/52 |

*Primary Examiner*—Gerard R. Strecker
*Attorney, Agent, or Firm*—H. L. Logan

[57] ABSTRACT

An electrical leakage path fault in the insulation of a buried conductor is located by applying, between the conductor and earth, an alternating signal which is then sensed at locations along the path of the conductor. The alternating signal is started at substantially the same phase angle at least once during each interval when it is being sensed. The sensed signal is rectified and divided by two to produce a reference signal which is phase compared with the sensed signal to trace the conductor to the fault.

13 Claims, 6 Drawing Figures

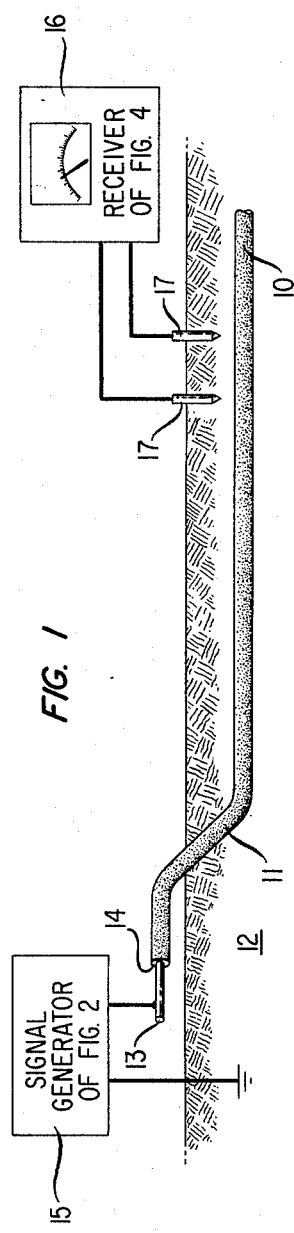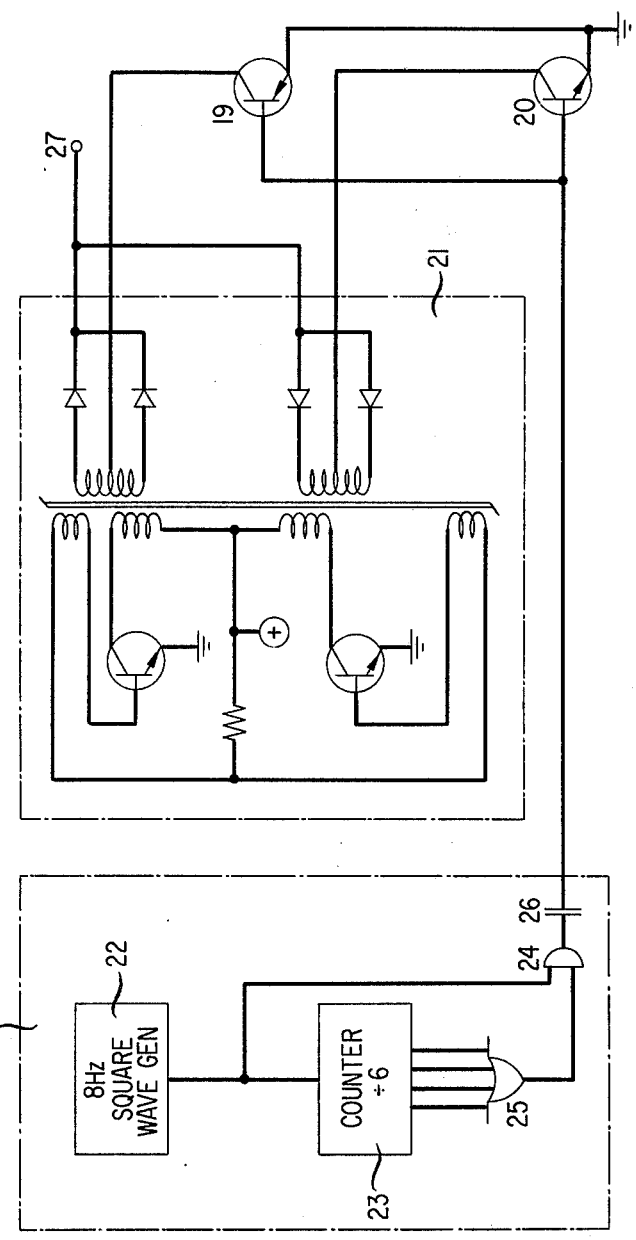

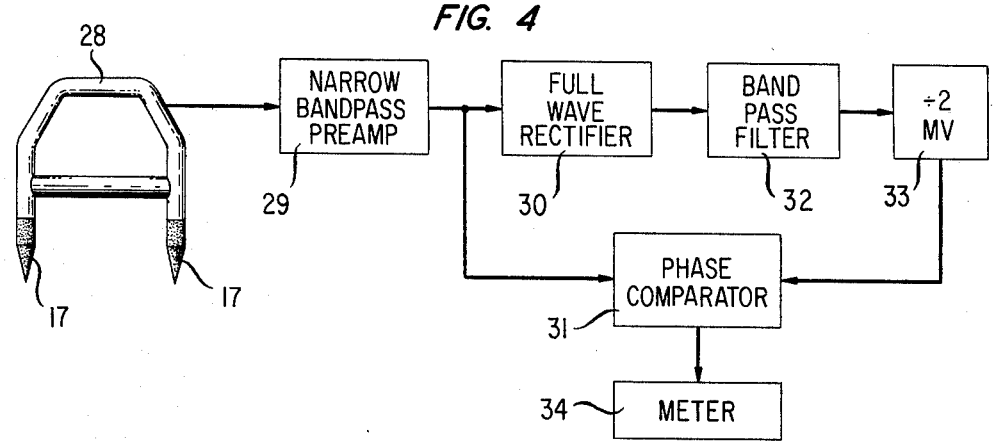
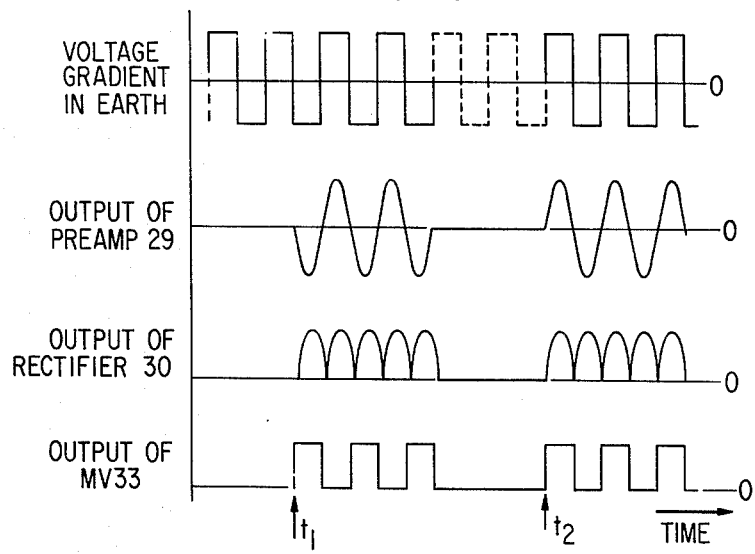
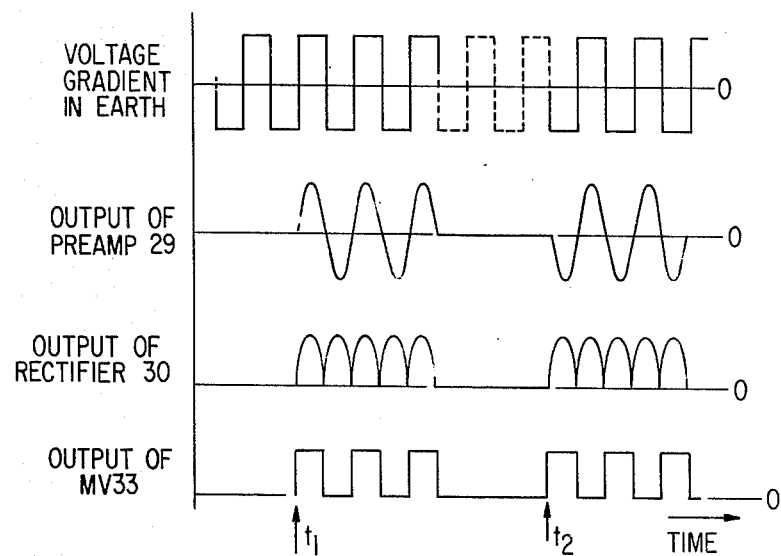

4,039,938

METHOD AND APPARATUS FOR DETECTING FAULTS IN BURIED INSULATED CONDUCTORS

BACKGROUND OF THE INVENTION

1. Field of the Invention

This invention relates to locating conductor-to-earth leakage paths through the insulation of buried conductors.

2. Description of the Prior Art

Telephone and electrical power lines are frequently buried in the earth for esthetic reasons and to reduce exposure to physical damage. These lines, however, do not always remain free of physical damage. The insulating material on a buried wire, for example, may be damaged during installation or as a result of earth shifting, rodent attack, or deterioration. When damage of this sort occurs, moisture in the earth often penetrates the insulation to provide a leakage path between the wire and the earth. On the other hand, when one or more wires are encased in a metallic sheath covered by insulating material, similar damage to this material often results in a leakage path between the metallic sheath and the earth. In either case, an electrical leakage path is provided between a metallic conductor and the earth which may have adverse effects on the intended function of the buried lines.

One technique for locating a fault of the above-described type applies an alternating test signal between the conductor and the earth and then uses a pair of earth probes to localize the fault by sensing the voltage gradient in the earth return path. With this technique, a phase reversal in the sensed voltage occurs as receiver probes transverse the fault. This is explained in detail in "Locating Cable Faults," by Charles A. Maloney, pp. 380–394 in *I.E.E.E. Transactions on Industry Applications*, Vol. 1A-9, No. 4, July/August 1973.

The above-mentioned technique has been utilized in test apparatus which applies a pulsed DC signal to a conductor under test and then detects the magnitude and polarity of probe-sensed pulses. It is also used in apparatus disclosed in U.S. Pat. No. 3,299,351, issued Jan. 17, 1967, to D. L. Williams. Williams' driving signal comprises a test signal and a second signal at one-half the frequency of the test signal. His receiver subsequently detects the test and second signals and utilizes the second signal to develop a reference signal for use in determining the relative phase of the detected test signal. Finally, the above-mentioned technique is utilized in method and apparatus disclosed in copending patent application Ser. No. 603,278, filed on Aug. 11, 1975, by T. V. Lathrop, now U.S. Pat. No. 3,991,363, and assigned to the same assignee as the present application. Lathrop's driving signal comprises a test signal and a second signal in the form of a carrier wave modulated by the test signal. At the receiver, the test and modulated signals are detected, the reference signal is derived from the detected modulated carrier wave, and the detected test signal is phase compared with the reference signal.

SUMMARY OF THE INVENTION

An object of the present invention is to produce a reference signal of the above-described type while using a driving signal which is easy to produce and which results in the derived reference signal and the detected test signal having substantially equal phase shifts as a result of the transmission characteristics of the transmission media.

This and other objects are achieved by producing a controlled alternating driving signal which is received via ground probes along the route of the buried conductor and processed in a particular manner. In particular, the driving signal is controlled so as to start at substantially the same phase angle at least once during each interval the ground probes are inserted in the earth. Furthermore, a reference signal is produced from the output of the ground probes by full-wave rectifying at least a portion (such as the fundamental) of the received signal and then dividing the rectified output by two, with the dividing action starting anew with each starting of the received signal. Because of this combined action, the correct phase relationship of the reference signal is always established notwithstanding the phase of the received signal because of the probe location with respect to the fault. The reference signal thus produced is then phase compared with the selected harmonic of the received signal to localize the fault.

In one embodiment of the invention, the driving signal comprises positive and negative potentials which are applied to a conductor in an alternating manner so as to generate alternating positive and negative rectangular waves with periodic interruptions of fixed durations. This arrangement assures a driving signal which starts at substantially the same phase angle at least once during each interval the probes are in the earth. Such a signal having relatively high potential levels is relatively easy to generate.

In accordance with the invention, at least a portion of the received signal is used both to generate the reference signal and also as the signal compared with that reference signal. A single frequency signal (i.e., a harmonic) may be used, for example, to both generate a reference signal and also as the signal which is phase compared with that reference signal. As a result, phase discrepancies between these two latter signals as a result of characteristics of the transmission media are nonexistent. This permits embodiments of the invention to be used over long lines without concern with respect to phase discrepancies caused by the line length.

These and other features of the invention will become more apparent from the following description of a specific embodiment.

BRIEF DESCRIPTION OF THE DRAWINGS

In the drawings:

FIG. 1 shows a block diagram of an embodiment of the invention in place for locating a fault in the insulation of a buried conductor;

FIG. 2 shows a generator which may be used in practicing the invention;

FIG. 3 is a plot of the output of the generator of FIG. 2;

FIG. 4 shows a block diagram of a receiver which may be used in practicing the invention; and FIGS. 5 and 6 are plots of signals in the receiver of FIG. 4.

DETAILED DESCRIPTION

FIG. 1 shows an embodiment of the invention in place for locating a fault in the insulation material on a buried transmission line. In particular, FIG. 1 shows a fault 10 in a transmission line 11 which is buried in earth 12. Line 11 comprises a conductor 13 surrounded by insulation material 14. Line 11 may be, for example, a single insulated wire, a group of insulated wires which are in turn encased in a metallic sheath covered by insulating material, or a coaxial cable where the outer conductor comprises a metallic sheath covered by insulation material. In the first-mentioned example, conductor 13 comprises the wire while in the last two mentioned examples conductor 13 comprises the metallic sheath. Fault 10, on the other hand, results from a defect of some form in insulation material 14 to provide a leakage path between conductor 13 and earth 12.

Generator 15 applies an alternating signal between conductor 13 and earth 12. This may, for example, take place at some point prior to line 11 going below the surface of earth 12. The frequency of this alternating signal may be similar to those of such signals used in the prior art for locating faults by tracking voltage gradients in the earth through the use of a pair of earth probes. In particular, this signal alternates at a rate low enough so that most of its energy travels in a path including the leakage path at the fault; that is, the alternating rate is low enough so that the effect of the capacitive coupling between conductor 13 and earth 12 along the length of line 11 does not mask the effect of the leakage path provided at fault 10.

In accordance with the invention, the alternating signal produced by generator 15 is produced in an interrupted manner with the signal having substantially the same phase each time it is restarted. This relationship will be further appreciated in a later presented discussion relating to the specific composite signal generator disclosed in FIG. 2.

FIG. 1 also shows a receiver 16 and a pair of earth probes 17. Probes 17 are used to sense the earth voltage gradient. The operation of receiver 16 and probes 17 will be further appreciated in a later discussion relating to specific apparatus disclosed in FIG. 4.

FIG. 2 shows a generator which may be used as generator 15 of FIG. 1. This generator produces an 8 Hz alternating square wave output which is ON for four cycles and OFF for two cycles. This is illustrated in FIG. 3. The peak-to-peak voltage may be in the order of hundreds of volts.

The generator of FIG. 2 comprises a control circuit 18, a conventional DC-to-DC converter 19 which is capable of producing both positive and negative outputs and a pair of switching transistors 20 and 21. Circuit 18 comprises an 8 Hz square wave generator 22 whose output is applied to both a divide-by-six counter 23 and an AND grate 24. Four out of the six outputs of counter 25 are applied to an OR gate 25, whose output is in turn applied to AND gate 24. In response to the output of OR gate 25, AND gate 24 is alternately enabled to pass four square waves and disabled to block two square waves from generator 22. A capacitor 26 connected to the output of AND gate 24 causes the output from circuit 18 to have both positive and negative excursions with respect to ground. The output of circuit 18 is applied to the bases of transistors 19 and 20.

The positive and negative output leads of converter 21 are connected to an output terminal 27. The ground lead associated with the positive lead is connected to the collector of transistor 19 while the ground lead associated with the negative lead is connected to the collector of transistor 20. The emitters of the two transistors are connected to ground. The output of circuit 18 causes transistors 19 and 20 to be alternately abled for four cycles of the 8 Hz square wave and disabled for two cycles of that wave. As a result, the waveform of the voltage appearing between terminal 27 and ground has the form shown in FIG. 3.

Fig. 4 shows a receiver which may be used when practicing the invention. Earth probes 17 of FIG. 1 are shown in FIG. 4 as being affixed to a handle structure 28 which facilitates in placing the probes in the earth at a fixed spaced-apart relationship. The voltage gradients sensed by probes 17 are applied to a conventional narrow passband preamplifier 29 which serves to extract the fundamental from the sensed signal. The output of preamplifier 29 is applied to both a full-wave rectifier 30 and a phase comparator 31. The output of rectifier 30 is filtered by a bandpass filter 32, divided by two by a multivibrator 33 and applied to phase comparator 31. The output of comparator 31 drives a meter 34.

The operation of the receiver of FIG. 4 is now considered in conjunction with the waveforms shown in FIGS. 5 and 6. These two FIGS. show voltage gradients in the earth wherein the gradients are 180° out of phase with one another because one is measured to one side of fault 10 of FIG. 1 while the other is measured to the other side of fault 10. Furthermore, each of these FIGS. have a time $t_1$ indicated which is the time when probes 17 are inserted in the earth.

In FIG. 5, the outputs of preamplifier 29 and multivibrator 33 are initially out of phase; however, at time $t_2$ they appear in phase and remain in phase for as long as probes 17 remain in that position. Of course, if the probes had been initially inserted at approximately the beginning of a positive half cycle of the earth voltage gradient (as, for example, at time $t_2$) the inputs to comparator 31 would have been initially in phase.

In FIG. 6, the outputs of preamplifier 29 and multivibrator 33 are initially in phase. At time $t_2$, they appear out of phase and remain so as long as probes 17 remain in that position. If the probes 17 had been initially inserted at approximately the beginning of a negative earth voltage gradient (as, for example, at times $t_2$), the inputs to comparator 31 would have been initially out of phase.

The in-phase and out-of-phase conditions discussed in the previous two paragraphs immediately indicate to a craftsperson as to which side of the fault the probes are located. When the probes are relocated and a permanent change occurs in the phase relationship, it is immediately recognized that the fault has been passed and the craftsperson by moving the probes back and forth can rapidly pinpoint the fault.

FIGS. 5 and 6 demonstrate how a correctly phased reference signal is either immediately established or established immediately following the first interruption in the 8 Hz earth voltage gradient. In this embodiment, the correct phase of the reference signal is where it is positive immediately following an interruption in the earth voltage gradient. Furthermore, with this four cycle ON and two cycle OFF pattern, the probability that a correctly phased reference signal immediately appears is 33⅓ percent; that an incorrectly phased reference signal immediately appears is 33⅓ percent; and that no reference signal immediately appears is 33⅓ percent. On the other hand, it is believed clear that in any case, a correctly phased reference signal is assured following the first interruption in the earth voltage gradient.

The initial incorrect phasing states of the reference signal as discussed above are corrected at the completion of the first interruption in the received signal. As a consequence, they are corrected before meter transients cease and, consequently, meter 34 for all practical purposes presents true indications.

In the above-described embodiment, a conventional DC-to-DC converter is used. As appreciated by those skilled in the art, that converter could be replaced by a center-tapped battery. The converter is, however, a convenient way to obtain high voltages. As also appreciated by those skilled in the art, a gated sine wave source could be used for generator 15.

From the above discussion, it is believed apparent that the present invention permits the use of relatively simple signal generators. Furthermore, it is believed apparent that it derives, in the receiver, a reference signal and a test signal from the same sensed signal, thereby eliminating any adverse effects produced by the transmission characteristics of the transmission media.

What is claimed is:

1. In a system for locating conductor-to-earth leakage paths through the insulation of buried conductors wherein said system comprises first means for producing a signal for application between a conductor of a buried insulated conductor and the medium in which it is buried, and second means for sensing said signal at discrete locations along the path of said conductor, for deriving a reference signal from said sensed signal and for phase comparing at least a portion of said sensed signal with said reference signal, an improvement in said system characterized in that, said signal produced by said first means comprises an alternating wave which is started at substantially the same phase angle at least once each time said second means is sensing said signal, and said second means comprises means for full-wave rectifying at least a portion of said sensed signal, means for dividing said rectified sensed signal by two with said dividing starting anew each time said sensed signal is started to thereby produce a reference signal and means for phase comparing said reference signal and at least a portion of said sensed signal.

2. A system in accordance with claim 1 in which said first means comprises
a source of positive and negative potentials,
a pair of output terminals, and
means for alternately gating said potentials to said output terminals for predetermined intervals with the same potential being gated thereto at the beginning of each of said intervals.

3. A system in accordance with claim 1 in which said second means rectifies the fundamental of said sensed signal.

4. A system in accordance with claim 2 in which said second means rectifies the fundamental of said sensed signal.

5. A system for locating conductor-to-earth leakage paths through the insulation of buried conductors, said system comprising
first means for applying a test signal between a conductor of a buried insulated conductor and the medium in which it is buried,
second means for sensing said test signal at discrete locations along the path of said conductor,
said test signal produced by said first means comprising an alternating signal which starts at substantially the same phase angle at least once each time said second means is in position for sensing said test signal, and third means for full-wave rectifying at least a portion of said sensed signal,
fourth means for dividing said rectified sensed signal by two with said dividing starting anew each time said sensed signal is started to thereby produce a reference signal, and
fifth means for phase comparing said reference signal with at least a portion of said sensed signal.

6. A system in accordance with claim 5 in which said first means comprises
a source of positive and negative potentials,
a pair of output terminals and means for alternately gating said potentials to said output terminals for predetermined intervals with the same potential being gated thereto at the beginning of each of said intervals.

7. A system in accordance with claim 5 in which said third means rectifies the fundamental of said sensed signal.

8. A system in accordance with claim 6 in which said third means rectifies the fundamental of said sensed signal.

9. A system for locating conductor-to-earth leakage paths through the insulation of buried conductors, said system comprising
first means for applying between a conductor of a buried insulated conductor and the medium in which it is buried an alternating test signal which is interrupted at least once and restarted each time at substantially the same phase angle,
second means for sensing said test signal at discrete locations along the path of said conductor, and
third means for full-wave rectifying at least a portion of said sensed signal,
fourth means for dividing said rectified sensed signal by two with said dividing starting anew each time said sensed signal is restarted to thereby produce a reference signal, and
fifth means for phase comparing said reference signal with at least a portion of said sensed signal.

10. A system in accordance with claim 9 in which said first means comprises
a source of positive and negative potentials,
a pair of output terminals and means for alternately gating said potentials to said output terminals for predetermined intervals with the same potential being gated thereto at the beginning of each of said intervals.

11. A system in accordance with claim 9 in which said third means rectifies the fundamental of said sensed signal.

12. A system in accordance with claim 10 in which said second means rectifies the fundamental of said sensed signal.

13. A method for locating an electrical leakage path through insulating material surrounding an elongated conductor buried in a conducting medium, said method comprising the steps of:
applying an alternating test signal between said conductor and said medium;
sensing said test signal at discrete locations along the path of said conductor;
controlling said test signal so that it starts at least once each time it is being sensed,
full-wave rectifying at least a portion of said sensed signal, dividing by two said rectified sensed signal, with said dividing beginning anew with each starting of said sensed signal, to produce a reference signal, determining whether said sensed test signal and said reference signal are in an in-phase relationship or an out-of-phase relationship; and selecting said discrete locations until two adjacent locations are found where said relationships change from one to the other, whereby said leakage path is located as between said two adjacent locations.

* * * * *